(12) United States Patent
Lee

(10) Patent No.: US 8,050,088 B2
(45) Date of Patent: Nov. 1, 2011

(54) PROGRAMMING METHOD OF NON-VOLATILE MEMORY DEVICE

(75) Inventor: Won-Hee Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 47 days.

(21) Appl. No.: 12/437,108

(22) Filed: May 7, 2009

(65) Prior Publication Data

US 2010/0020600 A1    Jan. 28, 2010

(30) Foreign Application Priority Data

Jul. 23, 2008  (KR) .................. 10-2008-0071725

(51) Int. Cl.
*G11C 11/34* (2006.01)
(52) U.S. Cl. .................. 365/185.03; 365/185.24
(58) Field of Classification Search ............. 365/185.03, 365/185.11
See application file for complete search history.

(56) References Cited

U.S. PATENT DOCUMENTS

| | | | |
|---|---|---|---|
| 5,677,873 A | 10/1997 | Choi et al. | |
| 5,715,194 A | 2/1998 | Hu | |
| 5,991,202 A | 11/1999 | Derhacobian et al. | |
| 6,061,270 A | 5/2000 | Choi | |
| 2007/0258286 A1 | 11/2007 | Higashitani | |
| 2008/0049494 A1* | 2/2008 | Aritome ................... | 365/185.02 |

OTHER PUBLICATIONS

Notice of Preliminary Rejection issued from Korean Intellectual Property Office on Jan. 12, 2011.

* cited by examiner

*Primary Examiner* — Michael Tran
(74) *Attorney, Agent, or Firm* — IP & T Group LLP

(57) ABSTRACT

A programming method of a non-volatile memory device having a drain select transistor, a source select transistor, and a plurality of memory cells connected between the drain select transistor and the source select transistor includes applying a program voltage, which increases stepwise according to a repetition of a program cycle, to a selected memory cell and applying a pass voltage, which decreases in inverse proportion to change of the program voltage, to some of unselected memory cells.

19 Claims, 8 Drawing Sheets

PROGRAMMING METHOD OF NON-VOLATILE MEMORY DEVICE

CROSS-REFERENCE TO RELATED APPLICATIONS

The present invention claims priority of Korean Patent Application number 10-2008-0071725, filed on Jul. 23, 2008, the disclosure of which is incorporated by reference herein in its entirety.

BACKGROUND OF THE INVENTION

The present invention relates to a semiconductor technology, and more particularly, to a programming method of a non-volatile memory device.

Recently, there are growing demands for semiconductor memory devices that can electrically erase and program data without refreshing stored data. Also, the mainstream technology is to increase storage capacity and integration density of semiconductor memory devices. A NAND flash memory device is one of non-volatile semiconductor memory devices that provide high capacity and high integration density without refreshing the stored data. Since a NAND flash memory device retains data even when power is off, it is widely used in electronic devices in which power supply may be abruptly interrupted, for example, portable terminals, laptop computers, and so forth.

A NAND flash memory device includes an array of memory cells comprising floating gate transistors. The array includes unit strings including memory cells, and the memory cells are serially connected between a drain select transistor and a source select transistor. A plurality of word lines are arranged to intersect the strings. The word lines are connected to control gates of the memory cells corresponding to the strings, respectively.

A programming operation of a typical NAND flash memory device will be described below.

First, a voltage of 0 V is applied to a selected bit line connected to a selected memory cell, and a program voltage VPGM is applied to the selected word line connected to the selected memory cell. In this way, electrons of a channel are injected into a floating gate by FN tunneling caused by a high voltage difference between a channel of the memory cell and a control gate. At this point, a pass voltage VPASS for transferring data (0 V) applied to the selected bit line to the selected memory cell is applied to unselected word lines connected to unselected memory cells among a plurality of memory cells disposed between a bit line and a ground terminal.

Although the program voltage VPGM is generally 18 V, it may be applied in a range between 16 V and 19 V by using an Incremental Step Pulse Programming (ISPP) scheme having a waveform diagram of FIG. 1 according to a program cycle in order to improve programming distribution. The pass voltage VPASS is applied with a fixed voltage of approximately 9 V.

A problem may occur when the selected memory cells connected to the corresponding word line are programmed without programming the unselected memory cells connected to the selected bit line. When the program voltage VPGM is applied to the selected word line, the program voltage VPGM is applied to the unselected memory cells arranged along the word line, as well as the selected memory cell. Thus, the unselected memory cells connected to the selected word line, especially the unselected memory cells adjacent to the selected memory cell, may be programmed. Such an unintended programming of the unselected memory cells connected to the selected word line is referred to as a program disturbance.

As one of technologies for preventing the program disturbance, a program inhibition method using a self boosting scheme has been proposed. The program inhibition method using the self boosting scheme is disclosed in U.S. patent application No. 5,677,873, entitled "Method Of Programming Flash EEPROM Integrated Circuit Memory Devices to Prevent Inadvertent Programming of Nondesignated NAND Flash Memory Cells Therein," and U.S. patent application No. 5,991,202, entitled "Method for Reducing Program Disturb During Self-Boosting In A NAND Flash Memory."

The program inhibition method using the self boosting scheme will be described below in detail with reference to FIG. 2.

First, a ground path is interrupted by applying a voltage of 0 V to a gate of a source select transistor SST. A voltage of 0 V is applied to a selected bit line, and a power supply voltage VCC of 3.3 V or 5 V is applied to unselected bit lines as a program inhibition voltage. Simultaneously, a source of a drain select transistor DST is charged to VCC-VTH (where VTH is a threshold voltage of the drain select transistor DST) by applying the power supply voltage VCC to a gate of the drain select transistor DST, and the drain select transistor DST is then substantially turned off. A program voltage VPGM is applied to a selected word line and a pass voltage VPASS is applied to unselected word lines, so that a channel voltage of a program-inhibited memory cell is boosted. The boosted channel voltage makes FN tunneling not occur between a floating gate and a channel. Consequently, the program-inhibited memory cell is kept in an initial erased state.

As another technology, a program inhibition method using a local self boosting scheme has been proposed. The program inhibition method using the local self boosting scheme is disclosed in U.S. patent application No. 5,715,194, entitled "Bias Scheme of Program Inhibit for Random Programming in a NAND Flash Memory," and U.S. patent application No. 6,061,270, entitled "Method for Programming a Non-Volatile Memory Device With Program Disturb Control."

The program inhibition method using the local self boosting scheme will be described in detail with reference to FIG. 3.

First, a ground path is interrupted by applying a voltage of 0 V to a gate of a source select transistor SST. A voltage of 0 V is applied to a selected bit line, and a power supply voltage VCC of 3.3 V or 5 V is applied to unselected bit lines as a program inhibition voltage. Simultaneously, a source of a drain select transistor DST is charged to VCC-VTH (where VTH is a threshold voltage of the drain select transistor DST) by applying the power supply voltage VCC to a gate of the drain select transistor DST, and the drain select transistor DST is then substantially turned off. A decoupling voltage VDCP of 0 V is applied to unselected word lines (for example, WL13 and WL15) immediately adjacent to a selected word line (for example, WL14), and a pass voltage VPASS is applied to the other unselected word lines. A program voltage VPGM is applied to the selected word line (for example, WL14). Consequently, like the self boosting scheme, the boosted channel voltage makes FN tunneling not occur between a floating gate and a channel of a program-inhibited memory cell. Thus, the program-inhibited memory cell is kept in an initial erased state.

According to the local self boosting scheme, the channel of the program-inhibited memory cell is restricted by memory cells connected to the unselected word lines to which the decoupling voltage VDCP is supplied. Therefore, the boosted channel voltage of the program-inhibited memory cell is further increased compared with the self boosting scheme.

The local self boosting scheme that can obtain higher channel voltage than the self boosting scheme is mainly used to program multi-level cells (MLC) that can store data of 2 bits or more. However, compared with the self boosting scheme, the local self boosting scheme has limitations in that a program speed is reduced.

FIG. 4 is a graph showing comparison of program threshold voltages PGM_VT in the self boosting scheme A and the local self boosting scheme B, that is, the program speed. It can be seen from FIG. 4 that the program threshold voltage in the local self boosting scheme B is reduced by approximately 300 mV to approximately 500 mV compared with the self boosting scheme A.

The cause of the reduction of the program speed in the local self boosting scheme is as follows. Generally, the program threshold voltage (that is, the voltage of the floating gate of the memory cell to be programmed) is affected by a capacitive coupling from the voltages of the floating gates of other memory cells. However, in the case of the local self boosting scheme, a decoupling voltage VDCP of 0 V is applied to word lines of the memory cells disposed on both sides of the memory cell to be programmed, and the program threshold voltage is not affected by the voltages of the floating gates disposed on both sides. For this reason, the program threshold voltage, that is, the program speed, is further reduced in the local self boosting scheme than in the self boosting scheme. The program speed could be increased by increasing the pass voltage VPASS. However, if a high pass voltage VPASS is used, disturbance characteristics of edge memory cells MC0 and MC15 adjacent to the select transistors DST and SST will be degraded.

SUMMARY OF THE INVENTION

Embodiments of the present invention are directed to providing a programming method of a non-volatile memory device capable of increasing a program speed and improving disturbance characteristics of edge memory cells adjacent to a select transistor.

In accordance with an aspect of the present invention, there is provided a programming method of a non-volatile memory device having a drain select transistor, a source select transistor, and a plurality of memory cells connected between the drain select transistor and the source select transistor, the programming method including: applying a program voltage, which increases stepwise according to a repetition of a program cycle, to a selected memory cell; and applying a pass voltage, which decreases in inverse proportion to change of the program voltage, to some of unselected memory cells.

DESCRIPTION OF SPECIFIC EMBODIMENTS

Other objects and advantages of the present invention can be understood by the following description, and become apparent with reference to the embodiments of the present invention.

In the figures, the dimensions of layers and regions are exaggerated for clarity of illustration. It will also be understood that when a layer (or film) is referred to as being 'on' another layer or substrate, it includes a meaning that the layer is directly on the other layer or substrate, or a meaning that intervening layers may also be present. Furthermore, it will be understood that when a layer is referred to as being 'under' another layer, it includes a meaning that the layer is directly under, or a meaning that one or more intervening layers may also be present. In addition, it will also be understood that when a layer is referred to as being 'between' two layers, it includes a meaning that the layer is the only layer between the two layers, or a meaning that one or more intervening layers may also be present.

Figure 1:
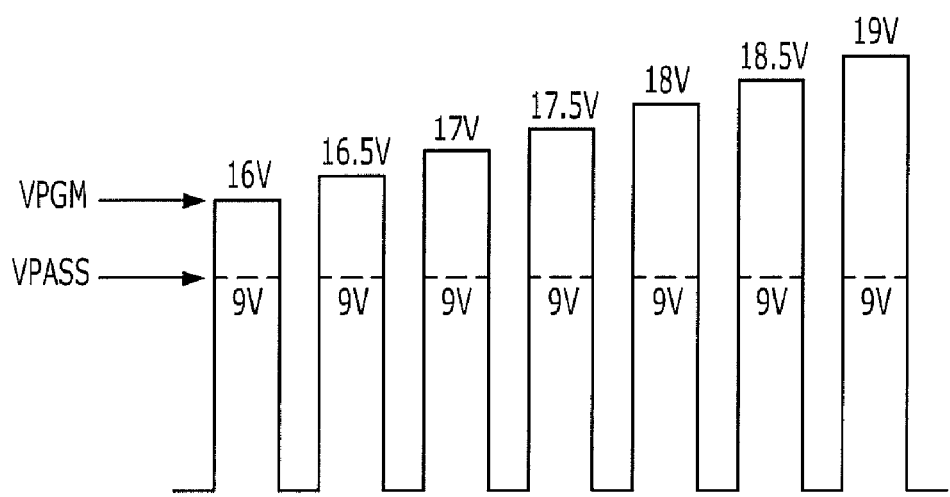
FIG. 1 is a waveform of a program voltage and a pass voltage for a conventional programming method of a non-volatile memory device.
Figure 2:
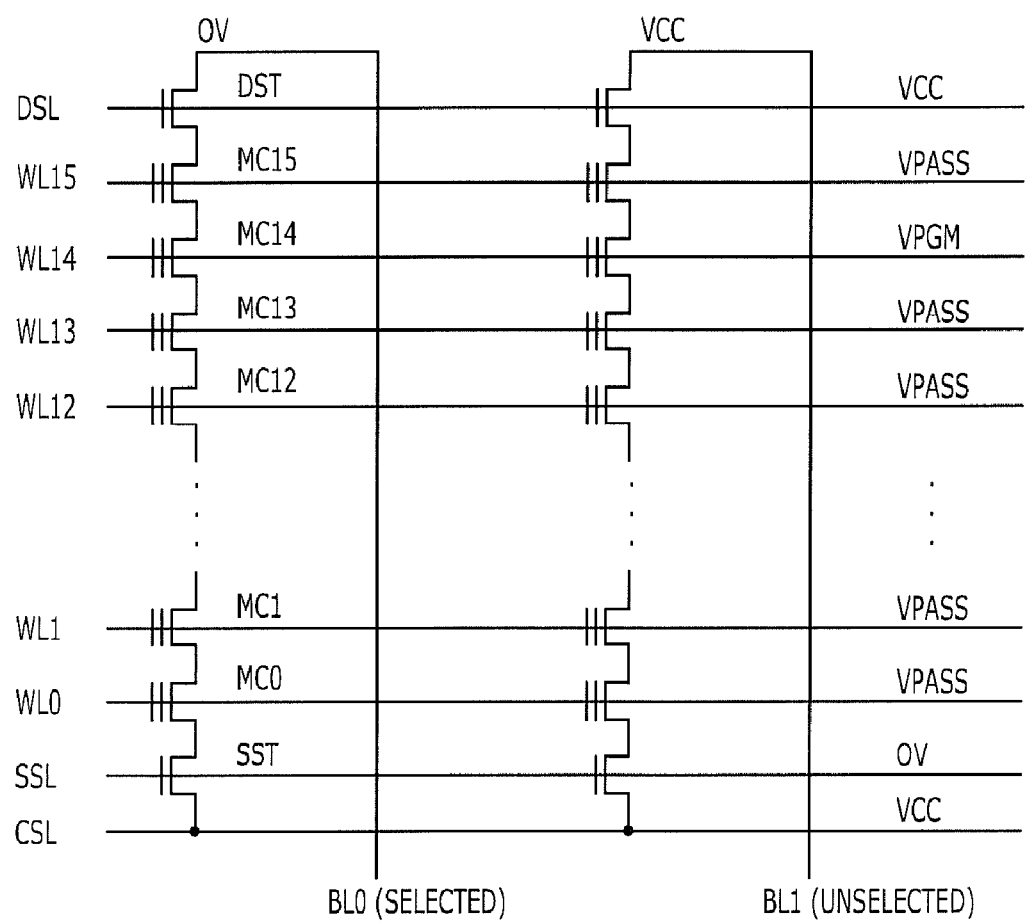
FIG. 2 is a circuit diagram for a program inhibition method using a self boosting scheme.
Figure 3:
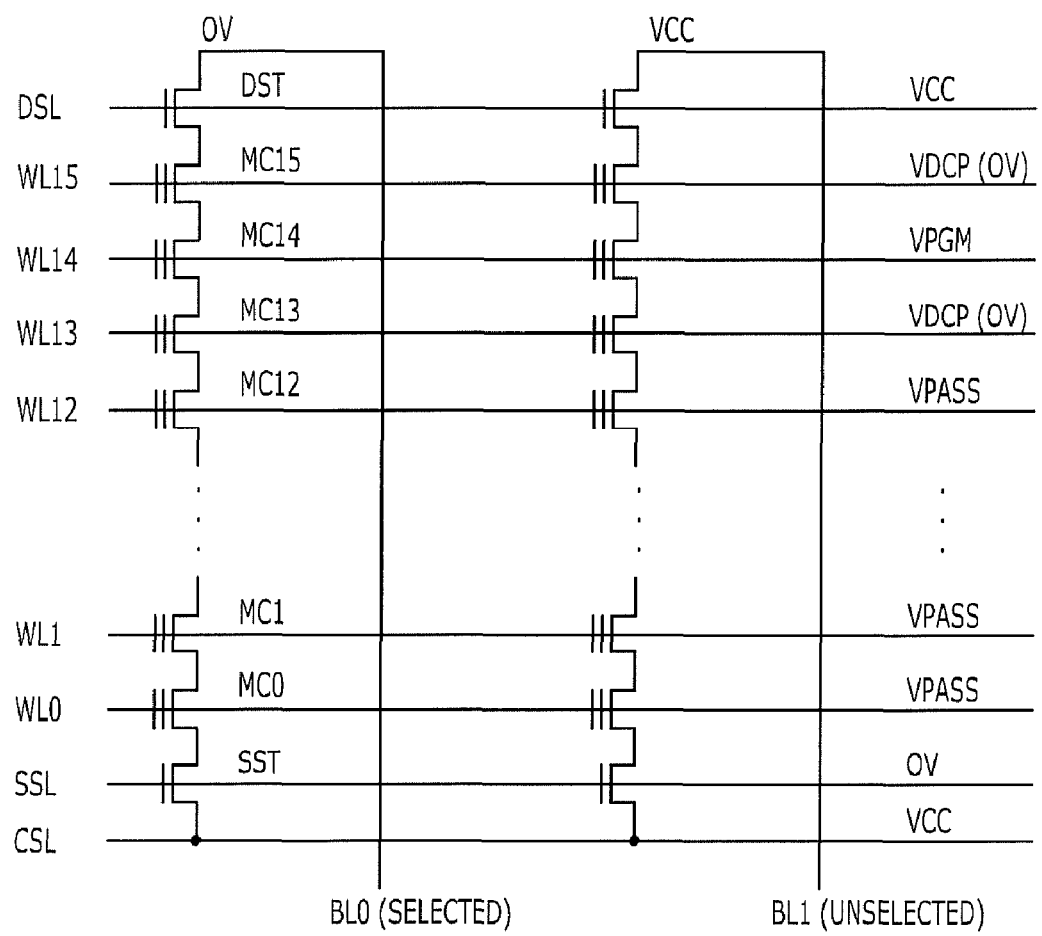
FIG. 3 is a circuit diagram for a program inhibition method using a local self boosting scheme.
Figure 4:
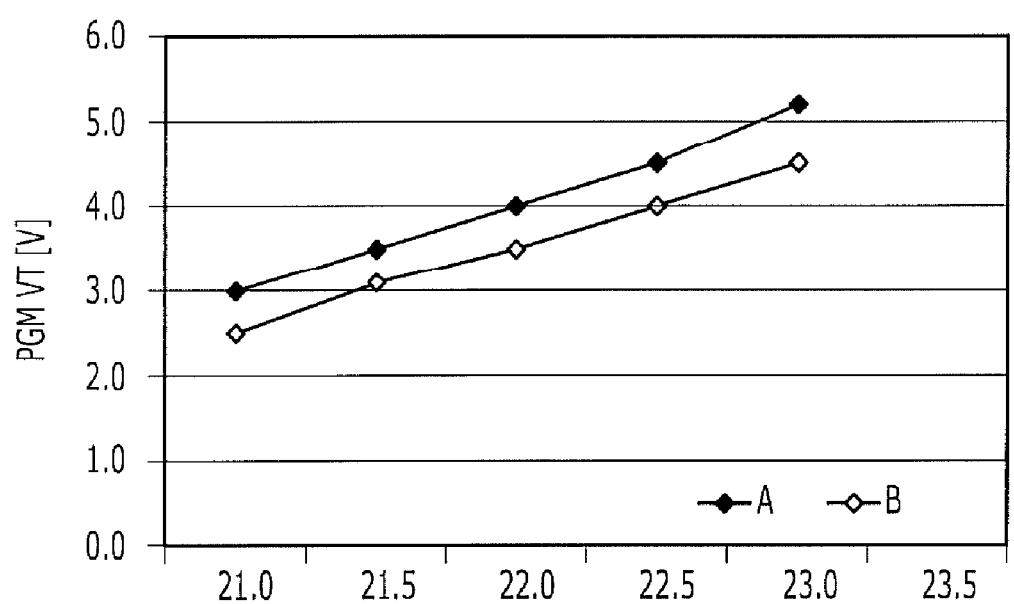
FIG. 4 is a graph showing comparison of program speed in the self boosting scheme and the local self boosting scheme.
Figure 5:
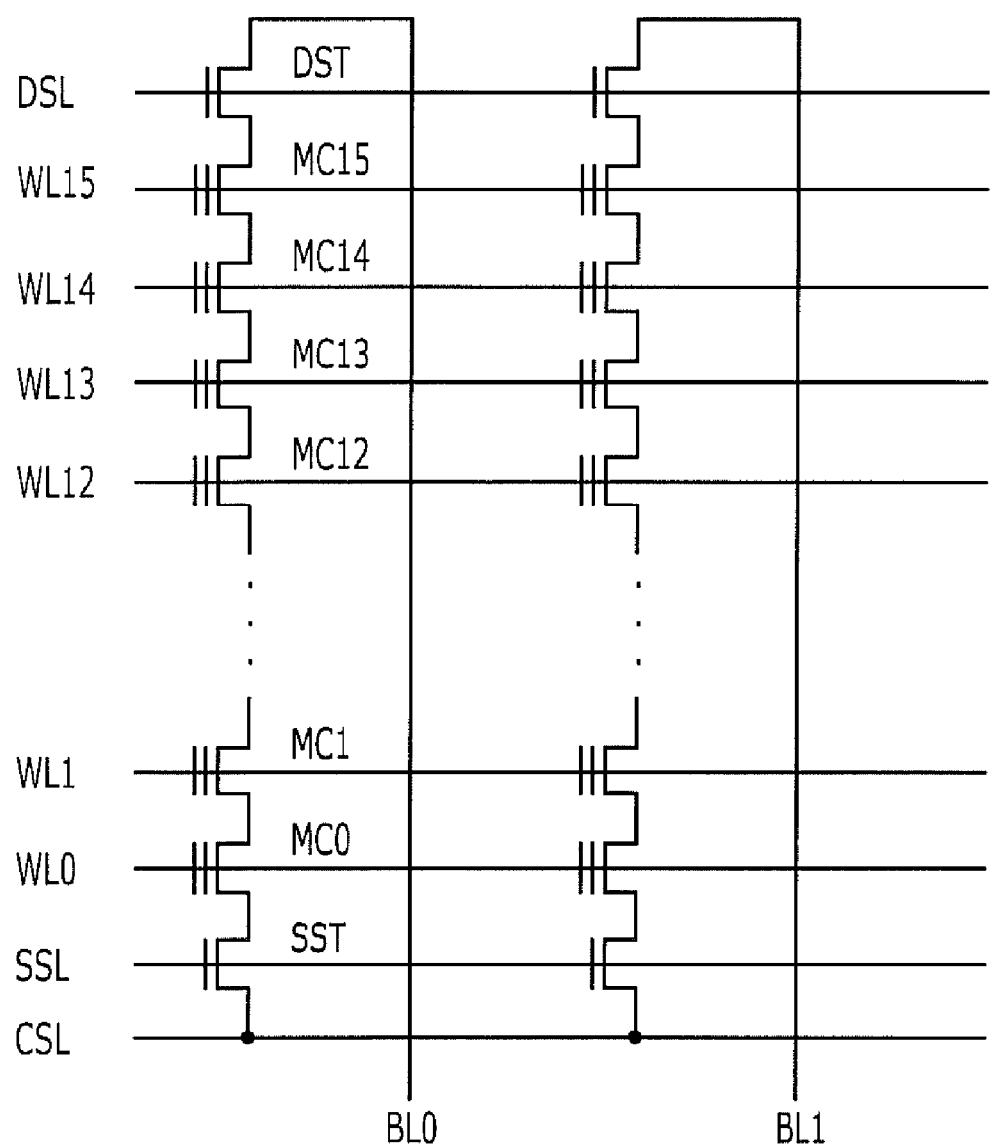
FIG. 5 is a circuit diagram of a non-volatile memory device in accordance with an embodiment of the present invention.

FIG. 5 is a circuit diagram of a non-volatile memory device in accordance with an embodiment of the present invention.

Referring to FIG. 5, the non-volatile memory device in accordance with the embodiment of the present invention includes a drain select transistor DST, a source select transistor SST, and a plurality of memory cells MC15, . . . , MC0 connected in series between the drain select transistor DST and the source select transistor SST to form a unit string. In the memory cells MC15, . . . , MC0, a floating gate and a control gate are stacked. A plurality of strings are connected in parallel to bit lines BL0, BL1, . . . to form one block. The blocks are symmetrically arranged around bit line contacts. The memory cells are arranged in rows and columns in a matrix form. Gates of the drain select transistor DST and the source select transistor SST arranged in the same columns are connected to a drain select line DSL and a source select line SSL, respectively. In addition, gates of the memory cells MC15, . . . , MC0 arranged in the same columns are connected to word lines WL15, . . . , WL0, respectively. Drains of the drain select transistors DST are connected to the bit lines BL0, BL1, . . . , respectively, and sources of the source select transistors SST are connected to a common source line CSL.

Meanwhile, the floating gates of the memory cells MC15, . . . , MC0 are formed over an active region and an edge portion of a field region defined on both sides of the active region, so that they are isolated from the floating gates of the adjacent memory cells. The control gates are connected to control gates of the adjacent memory cells including the floating gates formed separately between the field regions, thus forming word lines. Since the select transistors DST and SST are transistors that do not need to have floating gates configured to store data, they have a structure in which the floating gate and the control gate are connected together through a butting contact. Therefore, the select transistors DST and SST electrically operate as MOS transistors having a single-layer gate.

Generally, the program speed is increased as the program voltage VPGM is higher and the pass voltage VPASS is higher.

Figure 6:
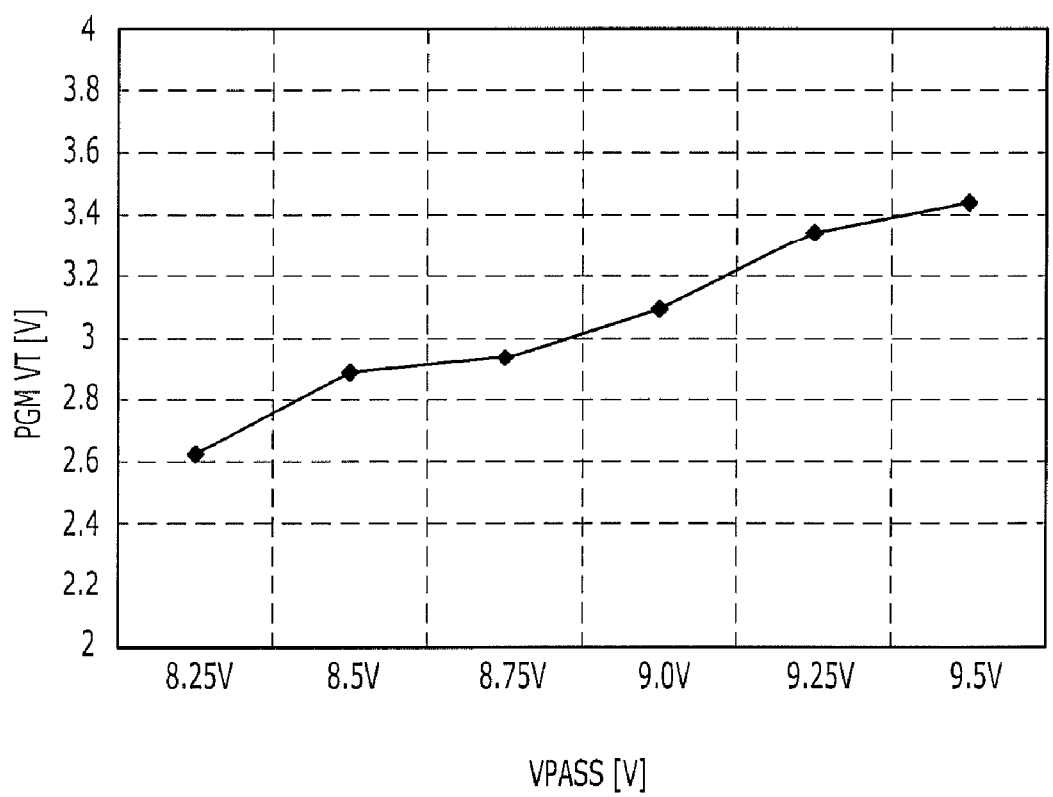
FIG. 6 is a graph showing the program speed according to the change of a pass voltage.

FIG. 6 is a graph showing the program speed PGM_VT according to the change of the pass voltage VPASS. It can be seen from FIG. 6 that the program speed can be increased if the pass voltage VPASS is increased. That is, a high pass voltage VPASS must be used for increasing the program speed.

However, if a high pass voltage VPASS is used, disturbance characteristics of the edge memory cells MC0 and MC15 adjacent to the select transistors DST and SST are degraded.

Specifically, if a high pass voltage VPASS is used, the channel boosting level is increased so that a difference between the channel voltage and the voltages (VCC, 0 V) applied to the select lines DSL and SSL becomes large. Thus, a strong electric field is formed between the channel and the select lines DSL and SSL. Due to the strong electric field, hot electrons are generated at the drains of the select transistors DST and SST. Also, the hot electrons are affected by the electric field and injected into the floating gates of the edge memory cells adjacent to the select transistors DST and SST. Consequently, the edge memory cells are undesirably programmed (disturbance). In particular, the source select line SSL through which a voltage of 0 V is applied to the gate has the largest voltage difference from the boosted channel. For this reason, the memory cell adjacent to the source select transistor SST is most vulnerable to disturbance.

In accordance with the embodiment of the present invention, the program speed is increased by using a high pass voltage VPASS in a program cycle during which a low program voltage VPGM is used, and disturbance characteristics of the edge memory cells are improved by using a low pass voltage VPASS in a program cycle during which a high program voltage VPGM is used.

Figure 7:
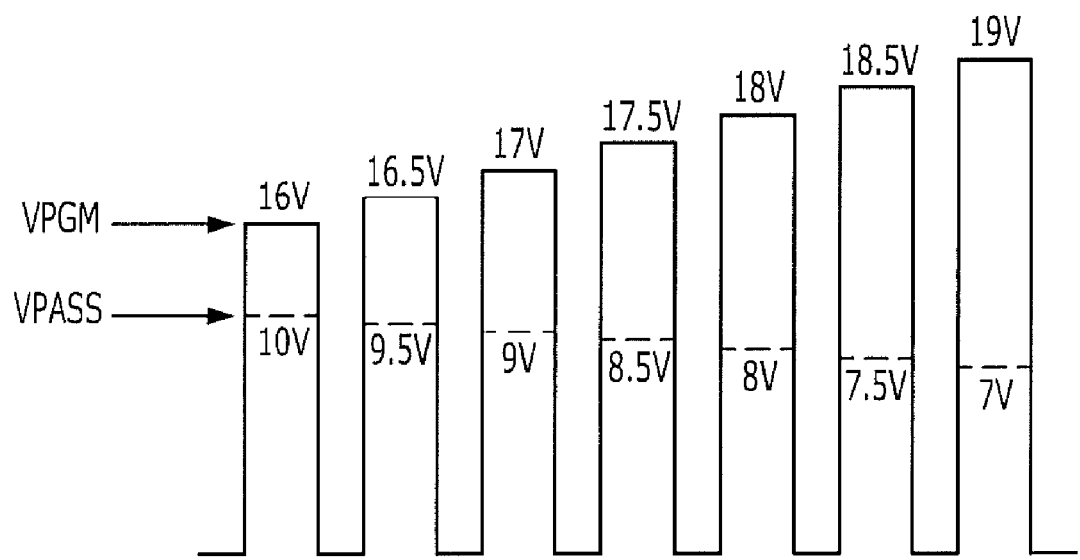
FIG. 7 is a waveform diagram of a program voltage and a pass voltage for the programming method of the non-volatile memory device in accordance with the embodiment of the present invention.

FIG. 7 is a waveform diagram of the program voltage VPGM and the pass voltage VPASS for explaining the programming method of the non-volatile memory device in accordance with the embodiment of the present invention.

Referring to FIG. 7, in the program operation of the non-volatile memory device in accordance with the embodiment of the present invention, the program voltage VPGM increasing stepwise according to the repetition of the program cycle by an ISPP scheme is applied to the selected word line, and the pass voltage VPASS decreasing in inverse proportion to the program voltage VPGM is applied to word lines that are not immediately adjacent to the selected word line.

Meanwhile, a voltage of 0 V is applied as the decoupling voltage VDCP to one or more word lines that are immediately adjacent to the selected word line.

As the program voltage VPGM is increased, the pass voltage is decreased in a first-order function or exponential function. The pass voltage VPASS is optimally adjusted so that the program speed can be increased and the disturbance of the edge memory cells adjacent to the select transistors can be reduced.

For example, the program voltage VPGM is applied, which increases stepwise from 16 V to 19 V by 0.5 V, and the pass voltage VPASS is applied, which decreases stepwise from 10 V to 7 V by 0.5 V.

Although the initial pass voltage is 10 V and the final pass voltage is 7 V in FIG. 7, the initial pass voltage may range from 9 V to 10 V and the final pass voltage may range from 7 V to 7.5 V.

In accordance with the embodiment of the present invention, the bias conditions except the word line voltage, that is, conditions of the bit line voltage, the drain select line (DSL) voltage and the source select line (SSL) line, are the same as the prior art. For example, a voltage of 0 V is applied to the source select line SSL; a voltage of 0 V is applied to the select bit line; a program inhibition voltage is applied to the unselected bit lines; and a power supply voltage VCC is applied to the drain select line DSL.

Meanwhile, instead of the same pass voltage VPASS, different pass voltages VPASS may be applied to the unselected word lines within a single program cycle. For example, a high pass voltage VPASS may be applied to the word line that is immediately adjacent to the drain select transistor DST, and a low pass voltage VPASS may be applied to the word line that is immediately adjacent to the source select transistor SST.

If a low pass voltage VPASS is applied to the word line that is immediately adjacent to the source select transistor SST, it is possible to improve disturbance characteristics of the edge memory cells adjacent to the source select transistor SST which is most vulnerable to disturbance characteristic.

As well known, a programming method of a multi-level cell (MLC) memory device capable of storing multi-bit data in a single memory cell is divided into an LSB program operation of programming lower-bit data and an MSB program operation of programming upper-bit data.

An LSB program voltage is applied to the selected word line in the LSB program operation, and an MSB program voltage is applied to the selected word line in the MSB program operation.

Since the MSB program operation is performed in a state where the threshold voltage of the memory cell is in a high state due to the LSB program operation, the program speed is unnecessarily lowered if the initial MSB program voltage is equal to the initial LSB program voltage. Therefore, a voltage higher than the initial LSB program voltage is used as the initial MSB program voltage. However, if the initial LSB program voltage is lower than the initial MSB program voltage, the program speed in the LSB program operation becomes lower than that in the MSB program operation.

For this reason, in accordance with the embodiment of the present invention, a voltage higher than the initial MSB pass voltage is used as the initial LSB pass voltage in order to compensate the reduction of the program speed caused by the low LSB program voltage.

Figure 8A:
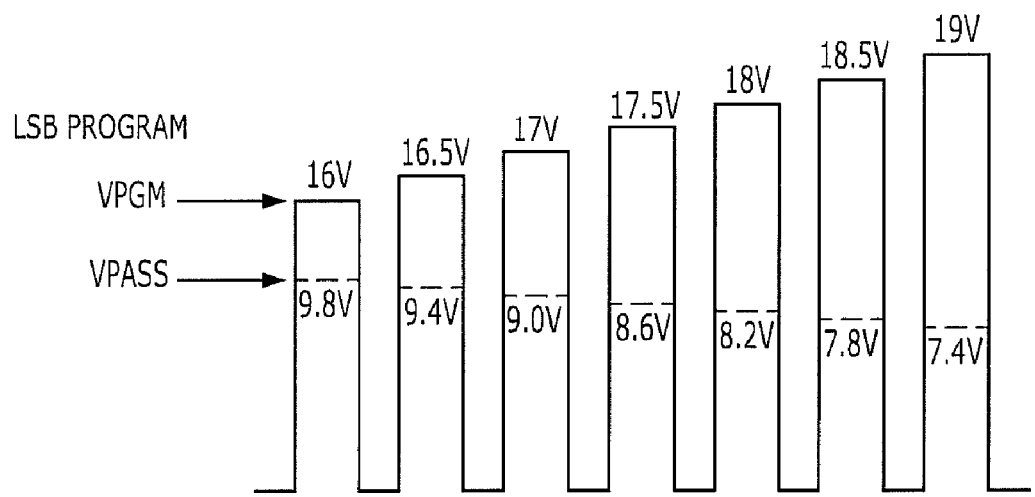
FIGS. 8A and 8B are waveform diagrams of a program voltage and a pass voltage for a programming method of a multi-level cell memory device in accordance with an embodiment of the present invention.
Figure 8B:
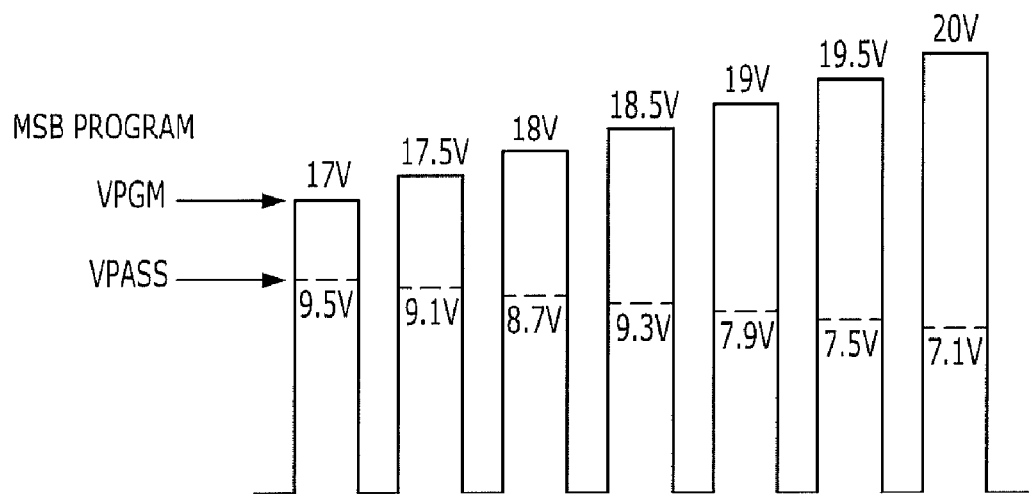

FIGS. 8A and 8B are waveform diagrams of the program voltage VPGM and the pass voltage VPASS in the programming method of the multi-level cell memory device in accordance with the embodiment of the present invention. Specifically, FIG. 8A is a waveform diagram of the program voltage VPGM and the pass voltage VPASS in the LSB program operation, and FIG. 8B is a waveform diagram of the program voltage VPGM and the pass voltage VPASS in the MSB program operation.

Referring to FIGS. 8A and 8B, in the LSB program operation, the LSB program voltage VPGM increasing stepwise according to the repetition of the program cycle by an ISPP scheme is applied to the selected word line, and the LSB pass voltage VPASS decreasing in inverse proportion to the LSB program voltage VPGM is applied to word lines that are not immediately adjacent to the selected word line. Meanwhile, a voltage of 0 V is applied as the decoupling voltage VDCP to one or more word lines that are immediately adjacent to the selected word line.

Like the LSB program operation, in the MSB program operation, the MSB program voltage VPGM increasing stepwise according to the repetition of the program cycle by an ISPP scheme is applied to the selected word line, and the MSB pass voltage VPASS decreasing in inverse proportion to the MSB program voltage VPGM is applied to word lines that are not immediately adjacent to the selected word line. Meanwhile, a voltage of 0 V is applied as the decoupling voltage VDCP to one or more word lines that are immediately adjacent to the selected word line.

As the LSB program voltage and the MSB program voltage are increased, the LSB pass voltage and the MSB pass voltage are decreased in a first-order function or exponential function. The LSB pass voltage and the MSB pass voltage are optimally adjusted so that the program speed can be increased and the disturbance of the edge memory cells adjacent to the select transistors can be reduced.

A voltage lower than the initial MSB program voltage is used as the initial LSB program voltage, and a voltage higher than the initial MSB pass voltage is used as the initial LSB pass voltage. In this way, if a voltage higher than the initial MSB pass voltage is used as the initial LSB pass voltage, the program speed lowered by the low LSB program voltage is compensated, resulting in increase of the program speed.

Although FIG. 8 shows the case where the initial LSB pass voltage is 9.8 V; the initial MSB pass voltage is 9.5 V; the final LSB pass voltage is 7.4 V; and the final MSB pass voltage is 7.1 V, the initial LSB pass voltage and the initial MSB pass voltage may range from approximately 9 V to approximately 10 V (where the initial LSB pass voltage>the initial MSB pass voltage), and the final LSB pass voltage and the final MSB pass voltage may range from approximately 7 V to approximately 7.5 V (where the finial LSB pass voltage>the final MSB pass voltage).

In accordance with the embodiment of the present invention, the bias conditions except the word line voltage, that is, conditions of the bit line voltage, the drain select line (DSL) voltage and the source select line (SSL) line, are the same as the prior art. For example, a voltage of 0 V is applied to the source select line SSL; a voltage of 0 V is applied to the select bit line; a program inhibition voltage is applied to the unselected bit lines; and a power supply voltage VCC is applied to the drain select line DSL.

Meanwhile, instead of the same pass voltage, different pass voltages may be applied to the unselected word lines within a single program cycle.

For example, a high pass voltage may be applied to the word line that is immediately adjacent to the drain select transistor DST, and a low pass voltage may be applied to the word line that is immediately adjacent to the source select transistor SST. It is possible to improve disturbance characteristics of the memory cells immediately adjacent to the source select transistor SST which is most vulnerable to disturbance characteristic.

In accordance with the embodiments of the present invention, the program speed can be increased by using a high pass voltage in a program cycle where the program voltage is low, and the disturbance characteristics of the edge memory cells adjacent to the select transistors can be improved by using a low pass voltage in a program cycle where the program voltage is high.

While the present invention has been described with respect to the specific embodiments, it will be apparent to those skilled in the art that various changes and modifications may be made without departing from the spirit and scope of the invention as defined in the following claims.

What is claimed is:

1. A programming method of a non-volatile memory device having a drain select transistor, a source select transistor, and a plurality of memory cells connected between the drain select transistor and the source select transistor, the programming method comprising:

applying a program voltage to a selected memory cell wherein the program voltage is increased; and applying a pass voltage to unselected memory cells wherein the pass voltage is decreased in inverse proportion to the program voltage, wherein a decoupling voltage is applied to the word lines of one or more unselected memory cells that are immediately adjacent to the selected memory cell.

2. The programming method of claim 1, wherein the program voltage is increased as a step voltage in a program cycle.

3. The programming method of claim 1, wherein the pass voltage is decreased in a first-order function or an exponential function.

4. The programming method of claim 1, wherein the program voltage is applied to a word line of the selected memory cell, and the pass voltage is applied to word lines of the unselected memory cells that are not immediately adjacent to the selected memory cell.

5. The programming method of claim 1, wherein the decoupling voltage is 0 V.

6. The programming method of claim 1, wherein the pass voltage is decreased stepwise from a first voltage to a second voltage.

7. The programming method of claim 6, wherein the first voltage ranges from approximately 9 V to approximately 10 V, and the second voltage ranges from approximately 7 V to approximately 7.5 V.

8. The programming method of claim 1, wherein the pass voltage applied to a memory cell immediately adjacent to the source select transistor is lower than the pass voltage applied to a memory cell immediately adjacent to the drain select transistor.

9. A programming method of a multi-level cell memory device having a drain select transistor, a source select transistor, and a plurality of memory cells each storing data of 2 bits or more and being connected between the drain select transistor and the source select transistor, the programming method comprising:

applying a first program voltage to a selected memory cell in a lower-bit program operation, and applying a first pass voltage to unselected memory cells wherein the first pass voltage is decreased in inverse proportion to the first program voltage; and applying a second program voltage to the selected memory cell in an upper-bit program operation, and applying a second pass voltage to the unselected memory cells wherein the second pass voltage is decreased in inverse proportion to the second program voltage, wherein an initial level of the second program voltage is higher than an initial level of the first program voltage, and an initial level of the second pass voltage is lower than an initial level of the first pass voltage.

10. The programming method of claim 9, wherein the first or second program voltage is increase as a step voltage in a program cycle.

11. The programming method of claim 9, wherein the first pass voltage is decreased in a first-order function or exponential function.

12. The programming method of claim 9, wherein the second pass voltage is decreased in a first-order function or exponential function.

13. The programming method of claim 9, wherein the first and second program voltages are applied to a word line of the selected memory cell, and the first and second pass voltages are applied to word lines of the unselected memory cells that are not immediately adjacent to the selected memory cell.

14. The programming method of claim 13, wherein a decoupling voltage is applied to the word lines of one or more unselected memory cells that are immediately adjacent to the selected memory cell.

15. The programming method of claim 14, wherein the decoupling voltage is 0 V.

16. The programming method of claim 9, wherein the first and second pass voltages are decreased stepwise from a first voltage to a second voltage.

17. The programming method of claim 16, wherein the first voltage ranges from approximately 9 V to approximately 10 V, and the second voltage ranges from approximately 7 V to approximately 7.5 V.

18. The programming method of claim 9, wherein the first pass voltage applied to a memory cell immediately adjacent to the source select transistor is lower than the first pass voltage applied to a memory cell immediately adjacent to the drain select transistor.

19. The programming method of claim 9, wherein the second pass voltage applied to a memory cell immediately adjacent to the source select transistor is lower than the second pass voltage applied to a memory cell immediately adjacent to the drain select transistor.

* * * * *